United States Patent [19]

Orban

[11] Patent Number: 4,888,789
[45] Date of Patent: Dec. 19, 1989

[54] ADJUSTABLE EQUALIZER FOR COMPENSATING FOR HIGH FREQUENCY ROLLOFF AND TYPICAL AM RECEIVERS

[76] Inventor: Robert A. Orban, 2413 Lincoln Ave., Belmont, Calif. 94002

[21] Appl. No.: 690,834

[22] Filed: Jan. 14, 1985

Related U.S. Application Data

[63] Continuation of Ser. No. 363,611, Mar. 30, 1982, abandoned.

[51] Int. Cl.$^4$ ............................................. H03H 7/30
[52] U.S. Cl. ..................................... 375/12; 330/302; 330/109; 381/98
[58] Field of Search ................... 455/108, 266, 267; 381/98, 99, 100, 101, 102, 103; 333/28 R; 375/12; 330/302, 303, 304, 109, 124, 294

[56] References Cited

U.S. PATENT DOCUMENTS

| | | | |
|---|---|---|---|
| 1,587,595 | 6/1926 | Lowenstein | 455/63 |
| 2,007,985 | 7/1935 | Seeley | 455/63 |
| 3,729,687 | 4/1973 | Orlandini et al. | 330/109 |
| 3,940,709 | 2/1976 | Heaslett | 381/103 |
| 4,113,983 | 9/1978 | Steel | 381/98 |
| 4,187,479 | 2/1980 | Ishizuka et al. | 333/28 R |
| 4,262,260 | 4/1981 | Tamura | 381/101 |
| 4,284,965 | 8/1981 | Higashi et al. | 381/101 |
| 4,290,335 | 9/1981 | Sondermeyer | 381/98 |
| 4,292,468 | 9/1981 | Yokoyama | 330/109 |
| 4,368,435 | 1/1983 | Bloy | 381/98 |
| 4,403,201 | 9/1983 | Yokoyama | 330/304 |

OTHER PUBLICATIONS

Terman, "Section 15-2 Radio Transmitter", in Radio Engineering, 1947 edition, McGraw-Hill Book Co.
Hanneman, "High-Order Rc-Active Filters", Philips Res Repts 26, 65–74, 1971.

*Primary Examiner*—Robert L. Griffin
*Assistant Examiner*—Stephen Chin
*Attorney, Agent, or Firm*—Blakely, Sokoloff, Taylor & Zafman

[57] ABSTRACT

An audio equalization circuit for use in an AM transmission system is described which is particularly useful for compensating for the high frequency rolloff found in currently manufactured AM receivers. A single potentiometer adjustment in the feedback path of the equalization circuit allows the response in the AM receiver to be effectively and economically adjusted.

12 Claims, 1 Drawing Sheet

ADJUSTABLE EQUALIZER FOR COMPENSATING FOR HIGH FREQUENCY ROLLOFF AND TYPICAL AM RECEIVERS

This application is a continuation of application Ser. No. 363,611, filed Mar. 30, 1982 now abandoned.

BACKGROUND OF THE INVENTION:

1. Field of the Invention.

The invention relates to the field of processing audio signals for AM transmitters to compensate for rolloff in typical AM receivers.

2. Prior Art.

While amplitude modulation (AM) broadcast transmitters of current design generally have flat modulation depth as a function of modulation frequency (frequency response), this is not true for typical AM receivers. Most AM receivers, particularly those manufactured between 1970 through 1981, have very poor high frequency response, that is, the high frequencies are rolled-off. The sound from these receivers is dulled and muffled unless high frequency preemphasis is applied to the audio signal prior to its transmission.

In prior art AM transmission systems, high frequency preemphasis or boosting is usually applied with conventional graphic or parametric equalizers having a biquadratic response. These equalizers only approximate the high frequency rolloff characteristics of the typical AM receiver. Indeed, the high frequency rolloff characteristics in these receivers is typically much steeper than can be compensated with equalizers using relatively wide-band biquadratic sections as is currently the practice.

As will be seen, the present invention describes a particularly economical circuit for generating an equalization curve which is complementary to typical AM receiver rolloff characteristics. Only a single, non-critical control is used to determine the amount of ultimate high frequency boost provided by the equalizer, thus the invented circuit can be easily used.

SUMMARY OF THE INVENTION

The present invention is used as part of an audio processing system to process an audio signal prior to its transmission. The pre-processing of the present invention is directed towards compensating the high frequency rolloff characteristics found in typical AM receivers. The present invention provides a substantial improvement over the processing techniques of the prior art which have not adequately compensated for the actual high frequency rolloff characteristics found in currently produced AM receivers.

In its presently preferred embodiment, the invented circuit includes an operational amplifier configured as a inverting amplifier. A filter is coupled between the output of this amplifier and its positive feedback terminal. A potentiometer in this feedback loop controls the amount of positive feedback introduced to the filter. This single potentiometer provides excellent control. The filter's characteristics are developed to compensate for the third-order Bessel function-like high frequency rolloff characteristics of a typical AM receiver. In this manner, a particularly economical means for accurately equalizing the high frequency rolloff is obtained and as will be seen, with a minimum of user adjustment.

DETAILED DESCRIPTION OF THE INVENTION

An equalization circuit is described which compensates for the poor high frequency characteristics of typical amplitude modulation (AM) radio receivers. Numerous specific details such as specific circuits, resistors and capacitor values, etc. are disclosed to provide a thorough understanding of the present invention. It will be obvious, however, to one skilled in the art that the present invention may be practiced without these specific details. In other instances, the operation and description of well-known devices such as operational amplifiers have not been described in detail in order not to unnecessarily complicate this disclosure.

As mentioned, the present invention is used as part of an audio processing system to pre-process the audio signal before its transmission. Currently, pre-processing is utilized including both dynamic range reduction (compression and limiting) and equalization (preemphasis) to compensate for the limited high frequency response of typical AM radios. However, after investigation of the response of typical AM radios, it has been found that the current pre-processing is inadequate.

Measurements of many typical AM radios manufactured between the period of 1975 through 1981 has shown a mean frequency response which closely matches a third-order Bessel-function lowpass filter with a response which is $-3$ dB at 2.0 kHz. (These filters are sometimes referred to as "Thompson" or "maximally-flat delay" filters).

(The following discussion uses specific s-plane poles and zeroes in order to explain the invention. The s-plane poles and zeroes are derived in a well-known manner using Laplace transforms. For convenience, all pole and zero locations are presented in a normalized form. The scale factor is such that 1 radian/sec. equals 1 kHz (i.e., all normalized frequencies must be multiplied by $2\#1000$.))

The Bessel filter which best approximates the rolloff of a typical AM radio has a (normalized) complex s-plane pole at $s = -1.9309\ j1.8241$, and a simple pole at $s = -2.4383$. As will be seen, the present invention provides complementary equalization, and therefore, the s-plane zeros are at the same frequencies.

With the present invention, a selection is made of the frequency at which the "boosting" is stopped. The higher this frequency, the larger the ultimate high frequency gain, and the more difficult it is to process such preemphasis without loss of loudness and/or distortion. The choice of this "cutoff frequency" is best made by the user of the system, since different programming formats, target audiences, and different characteristics of the transmission system will dictate different cutoff frequencies. A simple adjustment is provided; the adjustment may be subjectively made when listening to the response, for example, over a typical AM receiver or as described hereinafter.

Figure 1:
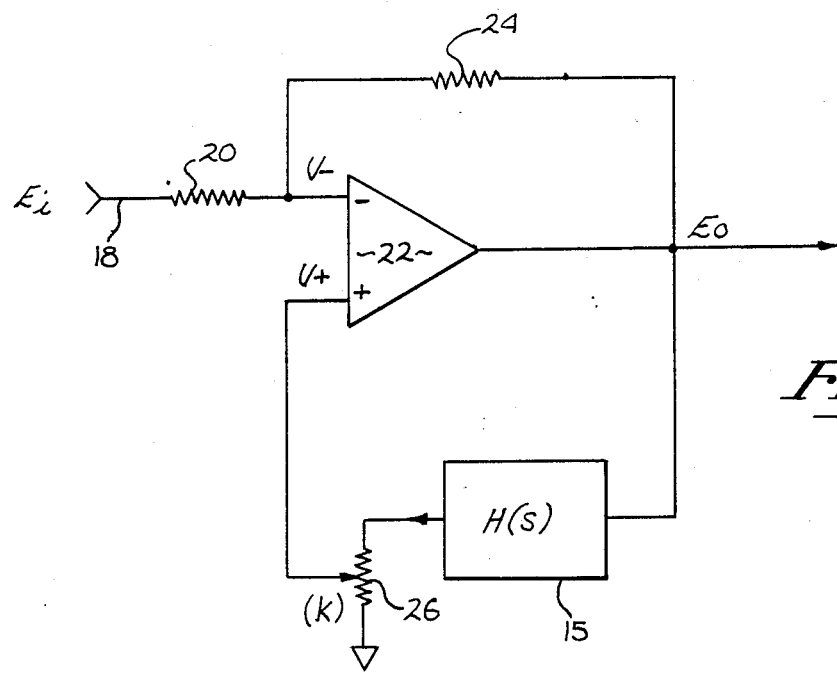
FIG. 1 is a block diagram of the invention.

The equalizer of the present invention is based upon the use of an operational amplifier configured as an inverting amplifier. The audio signal which is to be processed before transmission is coupled (line 18 of FIG. 1) to the negative input terminal of the amplifier 22 through a resistor 20. Negative feedback from the output of the amplifier is provided through resistor 24. Positive feedback is provided through filter 15. The output of filter 15 is coupled through a potentiometer 26 to adjust the amount of positive feedback introduced into the amplifier 22. The potentiometer 26 is the equalization control, which has been discussed above. Note that while the feedback from filter 15 is shown coupled to the positive input terminal of the amplifier 22, the feedback could also be introduced to the operational amplifier's negative input terminal if the filter 15 were made inverting instead of a non-inverting filter as used.

In the presently preferred embodiment, the cutoff frequency is selected for maximum equalization by adjusting the wiper of potentiometer 26 to that end of potentiometer 26 connected to capacitor 30. When this is done, the composite filter formed by cascading the circuit of FIG. 1 or the circuit of FIG. 2 with a third-order Bessel filter with a 2 kHz corner frequency (representing the AM radio) is a third-order Butterworth filter with a cutoff frequency of 6 kHz. For the equations shown in this application, this occurs when k=1, (k may be varied from 0 to 1 and represents the position of the wiper of potentiometer 26). The Butterworth filter is a "maximally flat magnitude" filter, and represents an excellent compromise between an excessively steep and abrupt rolloff (which would result in ripples in the passband frequency response and audible harshness due to ringing) and a gentle rolloff which would result in insufficient upper-midrange energy to achieve good musical definition and speech intelligibility. This composite filter has only three poles, since the s-plane zeroes of the equalizer exactly cancel the poles associated with the AM receiver (lowpass Bessel filter). The normalized composite filter poles are $s = -3 \pm j5.9162$ and $s = -6$.

The performance of the equalizer of the present invention has been analyzed by passing the signal from the invented equalizer through a third-order Bessel filter. An analysis of responses of this composite filter quickly reveal the advantage of the present invention. The adjustment of the potentiometer 26 causes the effective bandwidth of the AM receiver to vary from 2 kHz to 6 kHz with essentially flat response below the cutoff frequency. One would ordinarily expect to have to use a triple-ganged tracking potentiometer to obtain this favorable behavior because the equalizer is a third-order network. This behavior (obtained with a single potentiometer) is thus clearly superior and obviously economical.

In order to derive the location of the poles and zeroes of the side chain filter 15, the following analysis may be used. Assume that G(s) is the desired transfer function of the entire equalizer of FIG. 1 (or FIG. 2), N(s) and D(s) are the numerator and denominator of G(s) respectively, and H(s) represents the transfer function of filter 15. Then, the poles of H(s) are the same as the zeroes of G(s) (i.e., are the roots of N(s)), and the zeroes of H(s) are the roots of $D(s)+N(s)/R$. ($-1/R$ is the low frequency gain of the equalizer of FIGS. 1 and 2, more specifically, R is equal to the ratio of the resistance values of resistors 20 and 24.)

If $E_o = 1v$, then $V_+ = V_- = KH(s)$ $E_i = kH(s) + (H(S) - 1)/R = kH(s)(1 + 1/R) - 1/R$ $E_0/E_i = 1/(kH(s)(1 + 1/R) - 1/R)$ If the desired transfer function is:

$N(s)/D(s) = G(s) = 1/(kH(s)(1 + 1/R) - 1/R)$ then, $kH(s)(1 + 1/R)N(s) - N(s)/R = D(s)$ or $H(s) = (D(s) + N(s)/R)/(K(1 + 1/R)N(s))$ In the preferred embodiment, the poles of filter 15 (H(s)) are the same as the poles of the lowpass Bessel filter (representing the AM receiver) and the normalized zeroes of filter 15 are $s = -2.9009 \pm j1.8094$, and $s=0$ (i.e., a simple zero at zero frequency)

Figure 2:
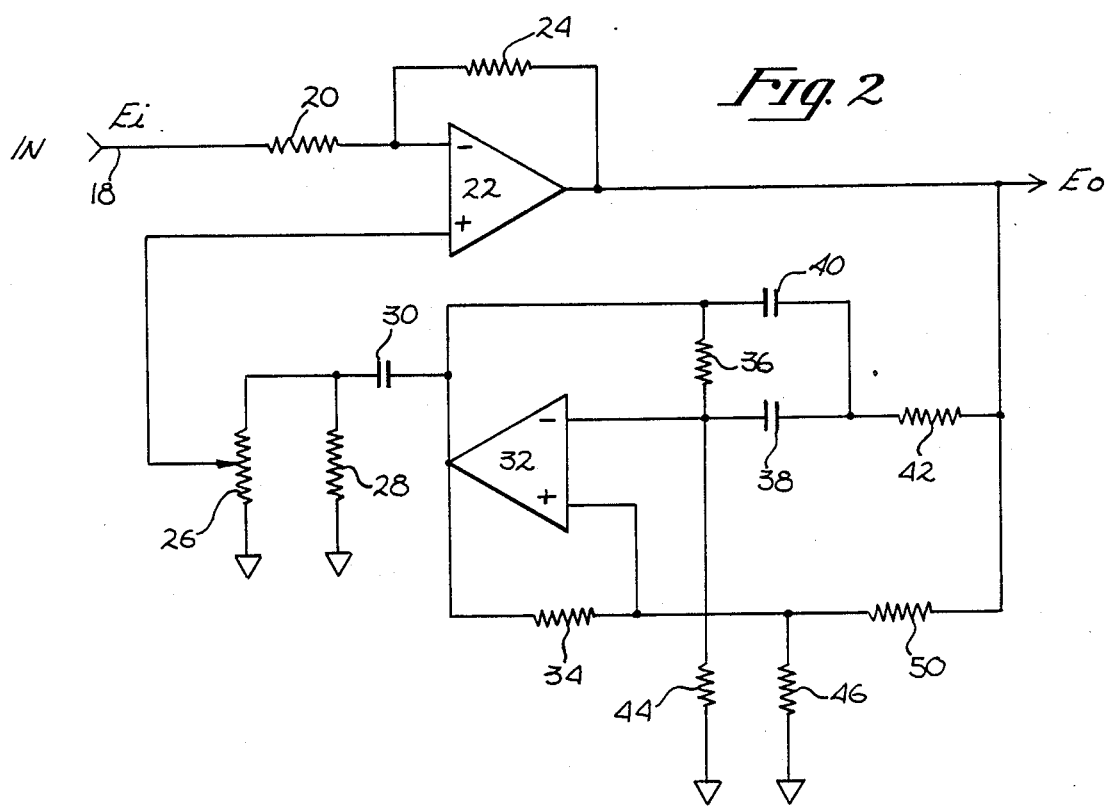
FIG. 2 is a circuit diagram of the presently preferred embodiment of the present invention.

Referring now to FIG. 2, operational amplifier 22, resistors 20 an 24 and potentiometer 26 of FIG. 1 are again shown in FIG. 2. The remaining circuitry of FIG. 2 represents the presently preferred realization of the filter 15 of FIG. 1.

This realization includes an operational amplifier 32. The negative input terminal of this amplifier is connected to ground through resistor 44, to the output line of the equalizer through capacitor 38 and resistor 42, and to the output of the amplifier through resistor 36. Capacitor 40 is coupled across the resistor 36 and capacitor 38. The positive input terminal receives positive feedback through resistor 34, is coupled to ground through resistor 46, and is coupled to the output line of the equalizer through resistor 50. A simple passive RC highpass section comprising capacitor 30 and resistor 28 is coupled to the output of the amplifier and provides the input signal to the amplifier 22 through potentiometer 26.

In the presently preferred embodiment, the values of the resistors are selected as follows: resistor 20 is 100k, resistor 24 is 12.4k, resistor 28 is 6.65k, resistor 34 is 100k, resistor 36 is 68.1k, resistor 42 is 48.7k, resistor 44 is 131k, resistor 46 is 78.7k, resistor 50 is 17.4k and potentiometer 26 is 500k. The values of the capacitors 38 and 40 are 1000 pf and capacitor 30 is 0.01 µf. Operational amplifers 22 and 32 are manufactured by Texas Instruments, Part No. TL072.

The low frequency gain of this circuit is 12.4k/100k or 1/8 to assure that the larger amount of high frequency boosting introduced through filter 15 will not cause clipping within the amplifier 22.

The biquadratic function with poles at $s=1.9309 \pm j1.8421$ and zeroes at $s = -2.9009 \pm j1.8094$ are realized in the circuit of FIG. 2 through the resistors 34, 36, 42, 44, 46 and 50, and capacitors 38 and 40 with their interconnection with the operational amplifier 32. This biquadratic function could have been realized in other ways, such as with a state-variable active circuit. The embodiment of FIG. 2 uses the single-amplifier "biquad" described in *IEEE Trans. Circuits and Systems,* CAS 22, No. 2, February 1975, pages 115–121 in an article entitled "STAR: An Active Biquadratic Filter Section" by J.J. Friend, C.A. Harris and D. Hilberman.

The remaining simple pole at $s = -2.4383$ and the zero at $s=0$ are realized through resistor 28 and capacitor 3, that is, a simple RC single-order highpass section.

The preferred realization described above has been found to be particularly suitable for current AM radios. If AM radios of the future are changed in design, then, of course, another third-order lowpass filter can be selected to represent them other than the third-order Bessel function with a 2 kHz corner frequency described above. Similarly, the equivalant filter produced by cascading the described equalizer with a filter representing the radio can be represented as having a characteristic other than the Butterworth, such as the Chevychev, Butterworth/Thompson or Thompson (Bessel). Also, the described techniques can be used to fabricate other equalizers of other orders such as a second or fourth order. However, it has been found that the third-order equalizer described above has very favorable flat composite frequency response as the equalization is varied as described.

Thus, an excellent and economical circuit for accurately equalizing the high frequency rolloff in a AM radio has been described. A filter for realizing the transfer function H(s) has been described and can be readily calculated by one of ordinary skill in the art using the information of this disclosure.

I claim:

1. An equalizer for an AM transmission system for compensating for high frequency rolloff in an AM receiver, comprises:
   an AM transmitter including said equalizer
   said equalizer having a differential amplifier;
   a first resistive feedback path coupling the output of said amplifier to one input terminal of said amplifier, said one input terminal also being coupled to receive an input audio signal; and
   a second feedback path coupling the output of said amplifier with the other input terminal of said amplifier, said second feedback path comprising a third-order filter and a potentionmeter disposed in said second feedback path for controlling the amount of said feedback, said filter for changing the spectral content of said audio signal,
   whereby said equalizer compensates for the high frequency rolloff in said AM receiver.

2. An equalization circuit for an AM transmitter for providing compensation for the poor high frequency characteristics found in typical AM radio receivers, comprising:
   an AM transmitter including equalization means;
   a feedback path coupled in said equalization means which includes a filler having s-plane characteristics comprising a complex zero and a simple zero and a complex pole and a simple pole, said filter for changing the spectral content of an auto signal; and
   a potentiometer disposed in said feedback path for controlling the feedback in said path,
   whereby compensation is provided for the high frequency rolloff found in typical AM receivers.

3. The improvement defined by claim 2 wherein said complex pole and simple pole correspond to the s-plane pole locations associated with the high frequency rolloff characteristics of said AM receiver.

4. The improvement defined by claim 3 wherein said simple zero is located at approximately $s=0$.

5. An equalizer for an AM transmission system for compensating for high frequency rolloff in an AM radio, comprising:
   an AM transmitter which includes said equalizer;
   said equalizer having a feedback path having a third-order filter for changing the spectral content of an audio signal; and
   a potentiometer disposed in said path for controlling the amount of feedback in said path,
   whereby said potentiometer controls the effective high frequency response in said AM radio.

6. The equalizer defined by claim 5 wherein the complex pole and simple pole locations of said filter correspond to the s-plane pole locations of a lowpass Bessel filter selected to represent the characteristics of said AM radio.

7. An equalizer for an AM transmission system for providing compensation for high frequency rolloff in AM receivers, comprising:
   an AM transmitter including said equalizer,
   said equalizer having an amplifier having two input terminals and an output terminal;
   said output terminal being coupled to one of said input terminals for providing a first feedback path;
   said output terminal being coupled to said other input terminal through a filter; and
   said filter being a third-order filter having s-plane characteristics comprising complex zeroes and a simple zero and complex poles and a simple pole, said filter for changing the spectral content of an audio signal,
   whereby high frequency rolloff compensation is provided for typical AM receivers.

8. The equalizer defined by claim 7 including a potentiometer coupled between the output of said filter and said other input terminal of said amplifier.

9. The equalizer defined by claim 8 wherein said first feedback path consists of a resistive coupling.

10. The equalizer defined by claim 9 wherein said complex poles and simple pole correspond to the pole locations associated with the high frequency rolloff characteristics of said AM receivers.

11. The equalizer defined by claim 10 wherein simple zero is located at $S=0$.

12. The equalizer defined by claim 10 wherein said one input terminal is a positive terminal and said other input terminal is a negative terminal.

* * * * *